United States Patent
Fonseca Junior et al.

(10) Patent No.: US 12,411,425 B2
(45) Date of Patent: Sep. 9, 2025

(54) FLUID PURGING SYSTEM

(71) Applicant: ASML Netherlands B.V., Veldhoven (NL)

(72) Inventors: José Nilton Fonseca Junior, Hamburg (DE); Zhuangxiong Huang, Eindhoven (NL); Franciscus Johannes Leonardus Heutz, Dommelen (NL); Ferdy Migchelbrink, Veldhoven (NL); Henricus Anita Jozef Wilhelmus Van De Ven, Echt (NL); Ramo Omerovic, Heerlen (NL); Emericus Antoon Theodorus Van Den Akker, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 440 days.

(21) Appl. No.: 18/001,256

(22) PCT Filed: May 10, 2021

(86) PCT No.: PCT/EP2021/062269
§ 371 (c)(1),
(2) Date: Dec. 8, 2022

(87) PCT Pub. No.: WO2021/249705
PCT Pub. Date: Dec. 16, 2021

(65) Prior Publication Data
US 2023/0314964 A1    Oct. 5, 2023

(30) Foreign Application Priority Data
Jun. 9, 2020 (EP) .................... 20179056

(51) Int. Cl.
*G03F 7/00* (2006.01)

(52) U.S. Cl.
CPC ...... *G03F 7/70933* (2013.01); *G03F 7/70883* (2013.01); *G03F 7/70925* (2013.01)

(58) Field of Classification Search
CPC ............. G03F 7/70933; G03F 7/70925; G02B 27/0006; B08B 5/02; B05B 12/082; H05G 2/009; H05G 2/0092; H05G 2/0094
See application file for complete search history.

(56) References Cited

U.S. PATENT DOCUMENTS 6,952,253 B2 10/2005 Lof et al.
10,539,887 B2 1/2020 Hao et al.
(Continued)

FOREIGN PATENT DOCUMENTS

JP    2012-043992 A    3/2012

OTHER PUBLICATIONS

International Search Report and Written Opinion of the International Searching Authority directed to International Patent Application No. PCT/EP2021/062269, mailed Jul. 28, 2021; 14 pages.
(Continued)

*Primary Examiner* — Steven H Whitesell
(74) *Attorney, Agent, or Firm* — Sterne, Kessler, Goldstein &Fox P.L.L.C.

(57) ABSTRACT

The present invention provides a fluid purging system (100) for an optical element (120), comprising a fluid guiding unit arranged to guide a fluid, provided by a fluid supply system, over at least a curved portion of an optical surface (122) of the optical element. The fluid guiding unit comprises a fluid inlet and a first nozzle unit (110) for providing a fluid to the optical surface. The fluid guiding unit being formed by at least a first wall portion (102) and at least a second wall portion (104), wherein the second wall portion being configured to face the optical surface and to follow a contour of
(Continued)

the optical surface. The second wall portion comprises a second nozzle unit (112).

15 Claims, 3 Drawing Sheets

(56) References Cited

U.S. PATENT DOCUMENTS

| | | | |
|---|---|---|---|
| 2005/0157278 A1* | 7/2005 | Owa | G03F 7/70825 |
| | | | 355/53 |
| 2006/0119811 A1 | 6/2006 | Simon | |
| 2012/0025109 A1 | 2/2012 | Abhari et al. | |
| 2012/0223257 A1* | 9/2012 | Nagai | G21K 5/00 |
| | | | 250/504 R |
| 2016/0143122 A1 | 5/2016 | Heo et al. | |
| 2017/0036252 A1 | 2/2017 | De Dea et al. | |
| 2017/0363973 A1* | 12/2017 | Venturino | G03F 7/70875 |
| 2018/0224748 A1* | 8/2018 | Nagai | G21K 1/06 |
| 2020/0146136 A1* | 5/2020 | Yu | H05G 2/0023 |
| 2020/0185212 A1* | 6/2020 | Ueda | G03F 7/70033 |

OTHER PUBLICATIONS

International Preliminary Report on Patentability directed to International Patent Application No. PCT/EP2021/062269, issued Dec. 13, 2022; 10 pages.

\* cited by examiner

FLUID PURGING SYSTEM

CROSS-REFERENCE TO RELATED APPLICATIONS

This application claims priority of EP application 20179056.5 which was filed on Jun. 9, 2020, and which is incorporated herein in its entirety by reference.

FIELD

The present invention relates to a fluid purging system and a purging method, and more particularly to a fluid purging system to prevent or to reduce contamination at an optical surface of an optical element.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

A lithographic apparatus may include an illumination system configured to condition a radiation beam before the radiation beam reaches the patterning device. Once the radiation beam has been patterned by the patterning device, a projection system directs the radiation beam to the substrate. The illumination system and the projection system comprise optical elements. Contamination of optical elements can lead to degradation in radiation beam uniformity, stray radiation (straylight) being lost from the system or even reaching the substrate and resulting in errors, and/or can result in the contaminants reacting with a surface of the optical elements, which can reduce the lifespan of the optical elements. Such optical elements may be situated within an ultra-clean fluid environment to prolong the lifetime of the optical elements of the illumination system and/or the projection system. The ultra-clean fluid environment may be termed a protective environment, or a micro-environment. This environment can reduce the optical element contamination (both cleanable and non-cleanable), thereby reducing the degradation in radiation beam uniformity, reducing the amount of stray radiation lost from the system and increasing lifespan of the optical element.

The fluid flow within the micro-environment can affect the purging performance. In conventional systems, the fluid may be provided to the micro-environment in such a way that stagnation points are generated in the fluid in the micro-environment. It is preferable to avoid such stagnation points, because these are zones in which the fluid is not moving and thus, purging is not effectively carried out. Back-flow may also occur in conventional systems where fluid containing contaminants reverses direction, for example by the Venturi-effect.

The fluid purging system of the present invention provides fluid flow over the optical element, which may improve purging performance on the surface of the optical element, for example, by reducing or avoiding stagnation points in the fluid flow over the optical element and/or back-flow of contamination and by providing a more shielding and laminar type of flow.

SUMMARY

An object of the present invention is to provide a fluid purging system for providing fluid to an optical element and herewith to provide improved purging of the optical element.

In the present invention, there is provided a fluid purging system for an optical element, comprising: a fluid guiding unit (or fluid directing unit) arranged to guide a fluid, provided by a fluid supply system, over at least a portion of an optical surface of the optical element, the fluid guiding unit comprises a fluid inlet and a first nozzle unit for providing a fluid substantially parallel to the optical surface, the fluid guiding unit may be formed by at least a first wall portion and at least a second wall portion, wherein the second wall portion being configured to face the optical surface and to follow a contour of the optical surface.

The fluid guiding unit may be arranged to guide a fluid, provided by the fluid supply system, over at least a curved portion of the optical surface of the optical element.

According to an embodiment of the invention, the second wall portion comprises a second nozzle unit. The second nozzle unit is arranged to prevent contamination of the optical surface as a result of a Venturi effect that may be induced by a flow of fluid provided by the first nozzle unit.

In order to obtain a more uniform fluid flow at the surface of the optical element, in an embodiment of the invention at least one of the first nozzle unit and the second nozzle unit comprises micro-sieve outlets.

In embodiment of the present invention, the first wall portion comprises a tilted portion, with the tilted portion configured to direct the purging fluid towards the optical surface. Herewith, the flow of purging fluid is guided to the optical element, and hereby, enhancing the interaction of the fluid flow with the optical element.

Efficiency of the contamination reduction and/or prevention may be enhanced by means of providing rounded edges at least one of the first wall portion and the second wall portion.

In an embodiment of the present invention, the fluid purging system comprises a first nozzle unit that is arranged to provide the fluid at a rate of 60% to 90% of a total fluid flow.

In an embodiment of the present invention, the fluid purging system has a first coating layer provided at at least one of the first wall portion and the second wall portion. The first coating layer may be a non-reflective layer, in order to prevent straylight in case, for example, exposure radiation interacts with the fluid purging system.

In an embodiment of the present invention, the fluid purging system has a second coating layer provided at a surface of at least one of the first nozzle unit and the second nozzle unit. The second coating layer is provided to lower the flow resistance and/or to prevent wear and/or corrosion of the surface In the present invention, there is also provided a projection system comprising the fluid purging system.

In the present invention, there is also provided an illumination system comprising the fluid purging system.

In the present invention, there is also provided a lithographic apparatus comprising the fluid purging system.

In the present invention, there is also provided a method for purging an optical element by a purging fluid. The method comprises the steps of; providing a first purging fluid at a first surface portion of the optical element via a first nozzle unit in a first direction, providing a second purging fluid at a second surface portion of the optical element via a second nozzle unit in a second direction, wherein an angle between the first direction and the second direction is in the range of 70 to 120 degrees.

Further embodiments, features and advantages of the present invention, as well as the structure and operation of the various embodiments, features and advantages of the present invention, are described in detail below with reference to the accompanying drawings.

BRIEF DESCRIPTION OF THE DRAWINGS

Embodiments of the invention will now be described, by way of example only, with reference to the accompanying schematic drawings, in which.

The features shown in the figures are not necessarily to scale, and the size and/or arrangement depicted is not limiting. It will be understood that the figures include optional features, which may not be essential to the invention. Furthermore, not all of the features of the system and/or lithographic apparatus are depicted in each of the figures, and the figures may only show some of the components relevant for a describing a particular feature.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
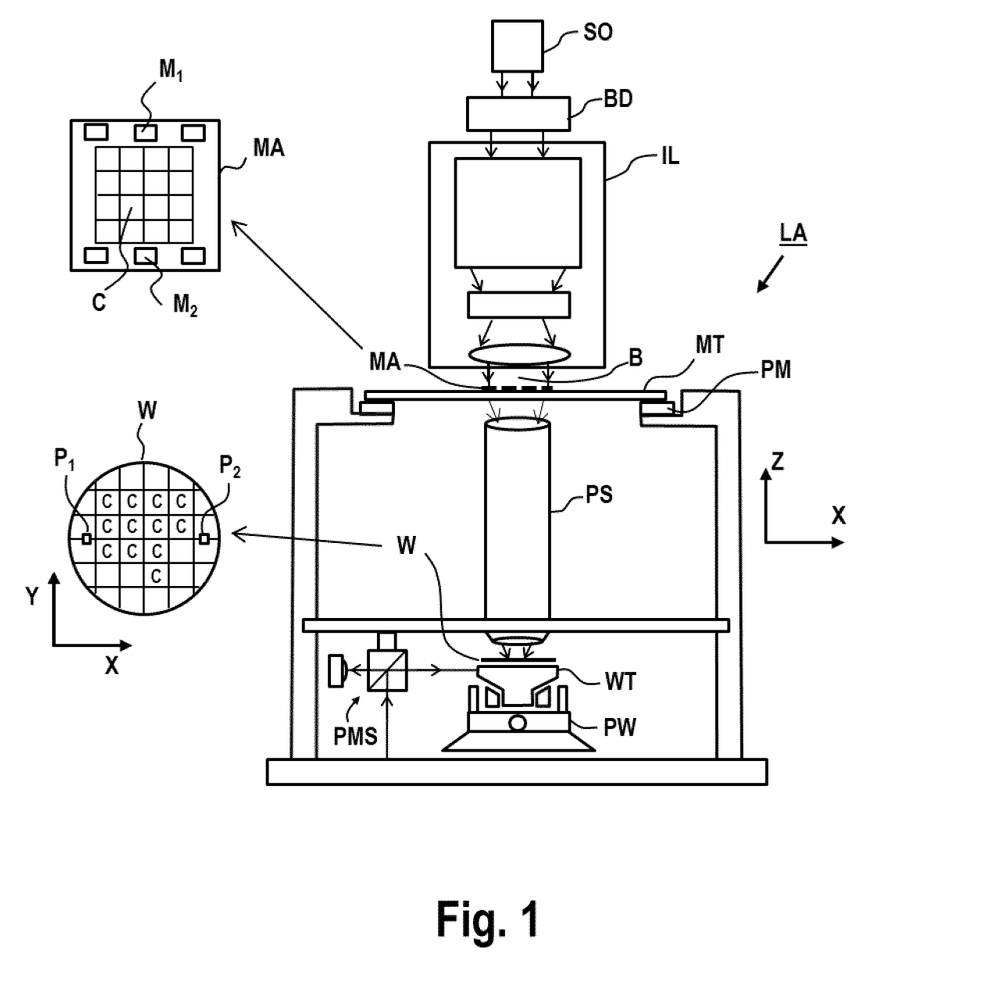
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

It has been identified that optical performance of known systems may suffer from contamination of optical elements, e.g., reflective elements such as mirrors and refractive element such as transmissive lenses, which may occur due to sub-optimal purging performance at the location of the optical element. In general, contamination of the optical element scales linearly with the amount of certain types of light and thus, any increase in throughput of the lithographic apparatus is likely to lead to an increase in lens contamination and thus, leads to more deterioration in optical performance. This would likely result in certain optical elements needing to be replaced earlier as the lifetime of the optical element might be reduced, or cleaned more frequently, which can disrupt performance of the apparatus.

Thus, it is beneficial to protect optical elements in a lithographic apparatus, such as lenses, from contamination. A known way of protecting such optical elements is to place the optical element in a semi-closed environment, which may otherwise be referred to as a purging volume, protective environment, a micro-environment, or a mini-environment. The semi-closed environment may be purged with clean fluid, e.g., clean gas, so that contaminants on or around the optical element surface can be removed, or at least reduced to a level which allows an improved lifetime of the optical element. Thus, the lifetime of an optical element may be dependent on the performance of the purging of the semi-closed environment.

For some systems, the purging performance (and thus, the lifetime of the optical element) depends on many factors, such as refreshment rate, overpressure with respect to outside environment, and purging uniformity.

The refreshment rate is related to purge flow velocity and the purging lengths. Generally, the higher the refreshment rate, the shorter the amount of time contamination remains on the optical element and thus, the shorter the amount of time any contamination has to react with the surface of the optical element, which may result in a lower contamination rate.

The pressure of the semi-closed environment is related to how closed the environment is and is governed by the elements, which define the semi-closed environment. The average pressure of the purging volume in the semi-closed environment should generally be higher than outside the environment, because this leads to an outflow of the purging fluid. This reduces the risk of back-flow of the purging fluid and thus, reduces the risk of back-flow of contaminants in the purging fluid.

It may be beneficial that the purge flow is uniformly-distributed along the optical element, because this may reduce or avoid stagnation points, recirculation of flow (which might contain contaminants), or turbulence of the purging fluid. In addition, the purge flow provides a more shielding and laminar type of flow at the surface of the optical element.

In the present invention, there is provided a fluid purging system, which will be described in detail below. The fluid purging system in the present invention may address some of the issues that are identified above.

Figure 2:
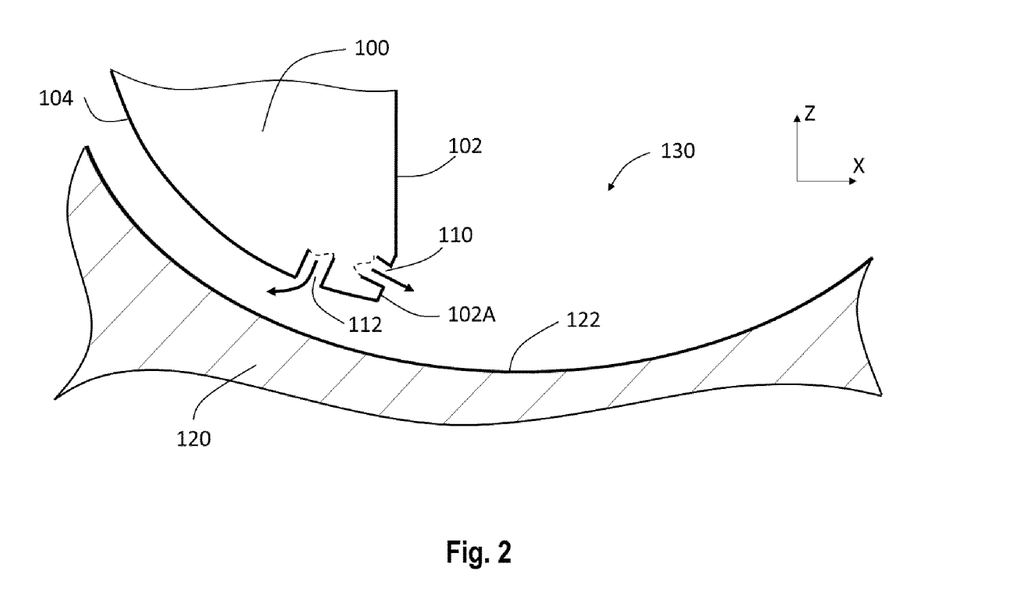
FIG. 2 depicts a schematic cross-section of a fluid purging system according to an embodiment.
Figure 3A:
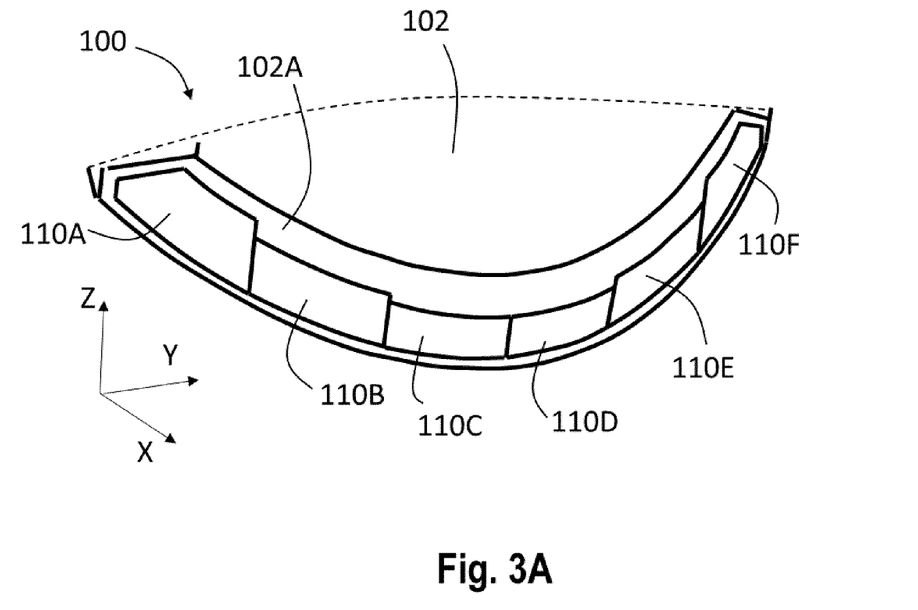
FIGS. 3A and 3B depict side-views of the fluid purging system according to an embodiment.
Figure 3B:
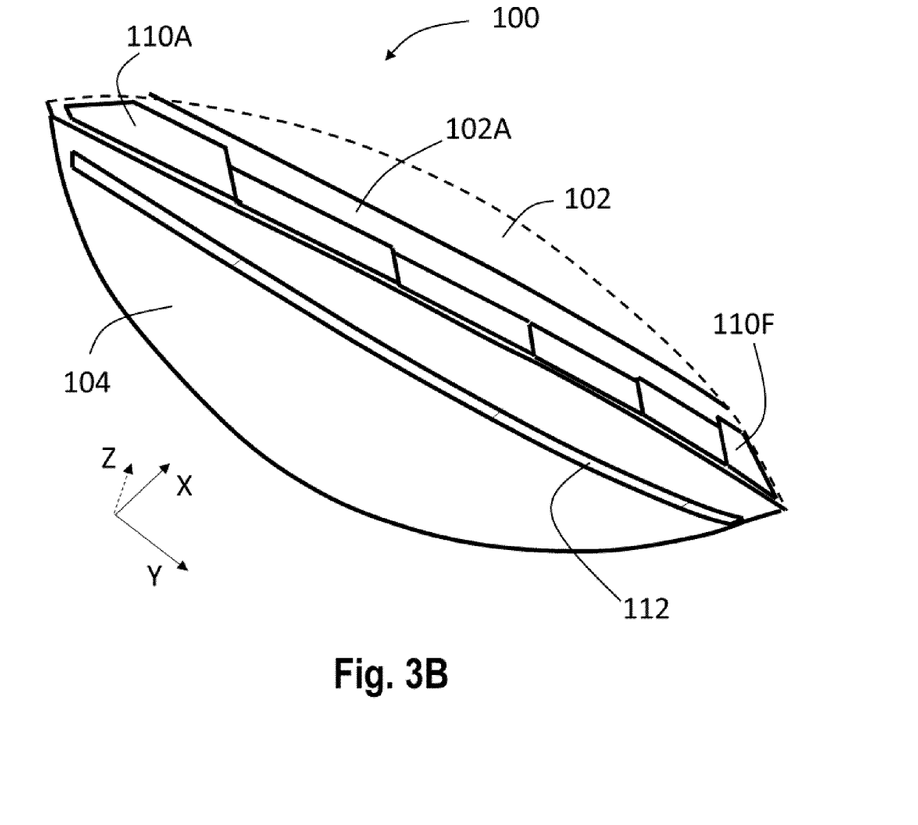

The fluid purging system of the present invention may be provided, for example, as shown in FIGS. 2, 3A, and 3B. FIG. 2 depicts a schematic cross-section of the fluid purging system 100 and FIGS. 3A and 3B depict the fluid purging system 100 from two different view-points.

The fluid purging system 100 is suitable for use with an optical element 120. Thus, the fluid purging system 100 can be used to provide purging fluid to the optical element 120. Although the optical element 120 is referred to below and is shown in the corresponding figures, the optical element 120 is representative of any appropriate optical element, including any refractive and reflective optical components. The any appropriate optical element may comprise the optical element 120 and/or may comprise another optical element within an optical system, such as the projection system PS or illumination system IL. The cross-section of the optical element 120, as illustrated in FIG. 2, is shown as having a concave shape. The optical element 120 may instead have a different shape, for example an anamorphic shape.

In an embodiment, the fluid purging system 100 comprises a fluid guiding unit arranged to guide the purging fluid (also referred as the fluid) over at least a portion of an optical surface 122 of the optical element 120, for example, over a curved portion of the optical surface 122 of the optical element 120. The purging fluid may be provided by a fluid supply system (not illustrated). The fluid guiding unit comprises a fluid inlet (not illustrated) and a first nozzle unit 110 for providing the purging fluid substantially parallel to the optical surface 122. The fluid guiding unit is formed by at least a first wall portion 102 and at least a second wall portion 104, wherein the second wall portion 104 is configured to face the optical surface 122 and to follow a contour of the optical surface 122. Thus, the second wall portion 104 is arranged to be closer to the optical surface 122 relative to the first wall portion 102. In case of a curved portion, the contour of the optical surface 122 may have a curved shape. By directing the purging fluid by means of the first nozzle unit 110 substantially parallel to the optical surface 122, an improved shielding flow at the optical surface 122 may be obtained. The second wall portion 104 may have a shape corresponding to the contour of the optical surface 122.

The (purging) fluid provided by the first nozzle unit 110, is provided to a space 130. The fluid being provided to the space 130 means that the fluid is provided to pass over the surface of the optical element 120, which is in or adjacent to the space 130. Thus, the fluid purging system 100 is configured to provide fluid to the surface of the optical element 120 adjacent to the space 130.

The space 130 may correspond to, or form at least part of, the purging volume as described above. Thus, the space 130 may correspond to, or form at least a part of, the semi-closed environment, micro-environment, protective environment, or mini-environment referred to above.

The fluid purging system 100 may comprise a fluid supply system (not illustrated). The purging fluid may also be provided by a separate fluid supply system that can be connected to the fluid purging system 100.

In an embodiment, the fluid purging system 100 comprises a second nozzle unit 112 arranged at the second wall portion 104, herewith providing a divided fluid outflow towards the optical element 120 (and to the space 130). The second nozzle unit 112 is arranged to provide a preventive fluid flow in order to prevent or minimize a leak flow that may be caused by the fluid flow when purging fluid is provided by the first nozzle unit 110. That is, by a so-called Venturi effect, a leak flow of a (potentially) dirty fluid is flowing around the fluid purging system 100, which may contaminate the optical element 120 closest to the fluid purging system. To prevent unwanted dirty leak flow as described by the Venturi effect, the second nozzle unit 112 may be provided at the second wall portion 104.

In FIG. 2, the arrows at the first nozzle unit 110 and the second nozzle unit 112 illustrate the flow direction of the purging fluid, as the purging fluid exits the fluid purging system 100 via the first nozzle unit 110 (first purging fluid) and second nozzle unit 112 (second purging fluid), respectively. The fluid flow direction at each location depends on the orientation and geometry of the nozzle unit at the location. In a preferred arrangement, the fluid flow (flow of second purging fluid) at the second nozzle unit 112 is directed away from the first nozzle unit 110. Herewith, the fluid flow by the Venturi effect induced by the fluid flow (flow of first purging fluid) at the first nozzle unit 110 is suppressed or reduced. Thus, minimizing a flow of potentially dirty fluid to the optical surface 122 of the optical element 120 that is being arranged to interact with the radiation, for example, the radiation used to expose semiconductor substrates.

The first purging fluid at a first surface portion of the optical element 120 is provided via the first nozzle unit 110 in a first direction and the second purging fluid at a second surface portion of the optical element 120 is provided via the second nozzle unit 112 in a second direction. An angle between the first direction and the second direction may be in the range of 70 to 120 degrees. Herewith, the second purging fluid may prevent contamination of the optical element as a result of a Venturi effect induced by the first purging fluid. In an embodiment, the first direction is essentially perpendicular to the second direction.

In an embodiment, the first nozzle unit 110 comprises a plurality of first micro-sieve outlets 110A-110F to create a uniform fluid flow pattern at the optical surface 122. The first micro-sieve outlets 110A-110F may vary in height across the first nozzle unit 110, for example, along the Y-direction as is illustrated by FIGS. 3A and 3B. The height of the first micro-sieve outlets 110C, 110D at the center of the first nozzle unit 110 may be lower than the height of first micro-sieve outlets 110A, 110F arranged at the outer sides of the first nozzle unit 110. Thus, the micro-sieve outlets at the center of the first nozzle unit 110 may have lower height than the micro-sieve outlets at the outer sides. In another example, the height of the first micro-sieve outlets 110C, 110D at the center of the first nozzle unit 110 may be higher than the height of first micro-sieve outlets 110A, 110F arranged at the outer sides of the first nozzle unit 110. Thus, the micro-sieve outlets at the center of the first nozzle unit 110 may have a higher height than the micro-sieve outlets at the outer sides. The height change of adjacent micro-sieve outlets 110A-110F may be a gradual change or a stepwise change. By means of the variation in height of the micro-sieve outlets 110A-110F, the flow rate of the purging fluid at the optical surface 122 can be controlled for locally optimized purging performance.

Although FIGS. 3A and 3B illustrate six micro-sieve outlets 110A-110F, the number of micro-sieve outlets is not limited to six. The illustrated number of micro-sieve outlets is for the illustrative purpose and does not bring limitation to the number of micro-sieve outlets provided at the first nozzle unit 110. The number of micro-sieve outlets 110A-110F arranged at the first nozzle outlet 110 may be more than six or may be less than six.

The second nozzle unit 112 may also comprise micro-sieve outlets to create a uniform flow pattern at the surface 122 of the optical element 120 facing the second nozzle unit 112.

In order to enhance the purging flow towards the optical surface 122 of the optical element 120, the first wall portion 102 may comprise a tilted portion 102A at the location of the first nozzle unit 110. The tilted portion 102A is arrange to be tilted towards the optical surface 122. The tilted portion 102A is configured to guide and to direct accordingly the flow of purging fluid more towards the optical surface 122, and herewith enhancing the purging performance of the fluid purging system 100 further.

Edges of both the first and second nozzle unit 110, 112 may be chamfered, rounded, or folded, to provide an optimized fluid flow outwards (e.g., a better guided and or more laminar flow). Herewith, an improved purging at the corners of the fluid purging system 100 may be obtained. This may be beneficial for reducing or avoiding stagnation points, recirculation of flow, or turbulence of the purging fluid.

The micro-sieve outlets 110A-110F may be arranged along a curved line. That is, the junction of the first wall portion 102 and the second wall portion 104 may not be a straight-line junction. For example, the first wall portion 102 (or the tilted portion 102A) may form a curved surface (e.g., partial cylindrical-shaped surface). Herewith, the micro-sieve outlets provided at the first wall portion 102 are provided along this curved surface (or line). As a result, the direction of the normal vector at a surface of the first wall portion 102 depends on the location at the curved surface. By means of the curved surface, the direction of the purge flow can be optimized in correspondence to the geometric surface properties of the optical element 120. Herewith, providing means to enhance the purging (and cleaning) efficiency of the fluid purging system 100.

The fluid guiding unit may comprise a manifold to guide the purging fluid towards the first nozzle unit 110 and/or towards the second nozzle unit 112. The manifold can be arranged to provide the purging fluid to one or more micro-sieve outlets, for example the micro-sieve outlets 110A-110F arranged at the first nozzle unit 110.

The purging fluid may be any appropriate fluid. The fluid may be gas, e.g., H2, N2, He, Ar, Kr, Ne, Xe, air, clean dry air (CDA), and extreme clean dry air (XCDA). In this case, reference to the fluid may be replaced with gas. In this case, the fluid purging system 100 may be a gas purging system, and the fluid supply system may be a gas supply system. The fluid may be clean gas. The fluid may be liquid, e.g., ultraclean water (or ultra-pure water). In this case, the fluid purging system 100 may be a liquid purging system, and the fluid supply system may be a liquid supply system.

The fluid as provided by the fluid purging system 100 may be guided and provided to the optical element 120 (and herewith to the space 130) by means of the first nozzle unit 110 and the second nozzle unit 112 in a ratio of, for example, 80:20, respectively. The first nozzle unit 110 may provide the main purging power, for example a first purge flow in the range of 60%-90% of the total purge flow, and the second nozzle unit 112 may provide a minor purge power, for example a second purge flow in the range of 40%-10% of the total purge flow (or fluid flow).

As the fluid purging system 100 can be used to purge (and clean) optical surfaces of optical elements that may be arranged in optical systems, for prevention and or reduction of contamination at the optical surface, the fluid purging system may be arranged in an illumination system (e.g., the illumination system IL as illustrated in FIG. 1), in a projection system (e.g., the projection system PS as illustrated in FIG. 1), or generally at an optical surface of an optical element in a lithographic apparatus (e.g., the lithographic apparatus LA as illustrated in FIG. 1) or in a metrology apparatus. Additionally, the fluid purging system 100 may be arranged at a collector mirror as used in an EUV light source to collect and to guide plasma-generated EUV radiation.

The outer surface of the fluid purging system 100, for example the outer surface of the first wall portion 102 (102a) and the outer surface of the second wall portion 104, may be provided with a first coating material (or first coating layer). The first coating material may be used to reduce of prevent undesired reflections and or straylight in case radiation, e.g., exposure radiation, interacts with the outer surface. The first coating material may form, for example, a non-reflective layer. The first coating layer may be a radiation absorbing layer. The first coating layer may be an anti-reflective coating layer. The first coating material at the outer surface of the fluid purging system 100 may also be provided to form a protective layer to its working environment. For example, the protective layer is provided to protect the outer surface against corroding fluids, which may impact the performance and/or the lifetime of the fluid purging system 100.

One or more surfaces of the first nozzle unit 110 and the second nozzle unit 112 may be provided with a second coating material (second coating layer). The second coating material may prevent wear and/or corrosion of the surfaces, e.g., a wear or corrosion preventive layer. Additionally, the second coating layer may enhance the flow of the purging fluid, i.e., reducing flow resistance, for example a fluid-phobic layer. A contact surface, which is designed to have a contact angle with the given fluid, which is 90° or larger, may be called a fluid-phobic contact surface. The fluid-phobic layer can be achieved with an oxidation coating, which is for example produced by plasma ionization. Alternatively or additionally, the fluid-phobic layer can be achieved with a coating with a suitable material with a thickness between 10 nm and 1000 nm.

The second coating layer may prevent contamination of the nozzle units 110, 112, for example, to prevent cloaking of the micro-sieves outlets.

The first coating layer and the second coating layer may comprise at least one same material.

The fluid purging system 100 may be removable from the environment (an optical system) or the space 130, where the fluid purging system is to be used for purging and cleaning an optical surface. Herewith, the fluid purging system 100 can be temporarily removed for maintenance purposes of the optical system comprising the fluid purging system 100. And the fluid purging system 100 can be replaced (or swapped) by a similar system, for example, in case of an upgrade or a malfunction of the fluid purging system 100.

The fluid purging system 100 may also be provided at an optical element during transport of the optical element. The optical element may be temporarily stored in a shipping container. By purging the optical element by means of the fluid purging system 100, contamination of the optical element may be prevented or minimized.

The present invention may provide a method of purging an optical element by means of the fluid purging system 100 as illustrated in FIGS. 2, 3A, and 3B. The method for purging an optical element by a purging fluid may comprise a step of providing a first purging fluid at a first surface portion of the optical element, e.g., the optical surface 122 of the optical element 120 (as illustrated in FIG. 2, 3A, or 3B), via a first nozzle unit 110 in a first direction, and a step of providing a second purging fluid at a second surface portion (e.g., the optical surface 122) of the optical element via a second nozzle unit 112 in a second direction. The first direction may be a direction substantially parallel to the optical surface 122. An angle between the first direction and the second direction may be in the range of 70 to 120 degrees. Herewith, the second purging fluid may prevent contamination of the optical element as a result of a Venturi effect induced by the first purging fluid. In an embodiment, the first direction is essentially perpendicular to the second direction.

In an embodiment, the first purging fluid and the second purging fluid may be provided by a same fluid supply unit.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Aspects of the invention are set out in the clauses below.

1. A fluid purging system for an optical element, comprising:
a fluid guiding unit arranged to guide a fluid, provided by a fluid supply system, over at least a portion of an optical surface of the optical element, the fluid guiding unit comprises a fluid inlet and a first nozzle unit for providing a fluid to the optical surface, the fluid guiding unit formed by at least a first wall portion and at least a second wall portion, wherein the second wall portion being configured to face the optical surface and to follow a contour of the optical surface.

2. The fluid guiding purging system according to clause 1, wherein the at least portion of the optical surface of the optical element is a curved portion.

3. The fluid purging system according to clause 1 or 2, wherein the second wall portion comprises a second nozzle unit.

4. The fluid purging system according to any one of clauses 1 to 3, wherein at least one of the first nozzle unit and the second nozzle unit comprises micro-sieve outlets.

5. The fluid purging system according clause 4, wherein the micro-sieve at the first nozzle unit have various heights.

6. The fluid purging system according to any one of preceding clauses, wherein the first wall portion comprises a tilted portion, with the tilted portion configured to direct the fluid towards the optical surface.

7. The fluid purging system of any one of preceding clauses, wherein the optical surface of the optical element comprises at least a concave portion.

8. The fluid purging system of any one of the preceding clauses, wherein an edge of the at least one of the first wall portion and the second wall portion is rounded.

9. The fluid purging system of any one of the preceding clauses, wherein the first nozzle unit is arranged to provide the fluid at a rate of 60% to 90% of a total fluid flow.

10. The fluid purging system of any one of the preceding clauses, wherein at least one of the first wall portion and the second wall portion is provided with a first coating layer.

11. The fluid purging system according clause 10, wherein the first coating layer is a non-reflective layer.

12. The fluid purging system of any one of the preceding clauses, wherein a surface of at least one of the first nozzle unit and the second nozzle unit is provided with a second coating layer.

13. The fluid purging system according clause 12, wherein the second coating layer is a fluid-phobic layer.

14. The fluid purging system according clause 12, wherein the second coating layer is a wear preventive layer.

15. A projection system comprising the fluid purging system of any one of the preceding clauses.

16. An illumination system comprising the fluid purging system of any one of clauses 1 to 13.

17. A lithographic apparatus comprising the fluid purging system of any one of clauses 1 to 13.

18. A method for purging an optical element by a purging fluid, comprising the steps of; providing a first purging fluid at a first surface portion of the optical element via a first nozzle unit in a first direction, providing a second purging fluid at a second surface portion of the optical element via a second nozzle unit in a second direction, wherein an angle between the first direction and the second direction is in the range of 70 to 120 degrees.

19. The method according clause 18, wherein the first direction is essentially perpendicular to the second direction.

20. The method of clause 18 or 19, wherein providing the first purging fluid and the second purging fluid are provided by a same fluid supply unit.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A fluid purging system comprising:
a fluid guiding unit arranged to guide a fluid, provided by a fluid supply system, over first and second portions of a curved optical surface of an optical element, the fluid guiding unit comprising:
a fluid inlet;
a first nozzle disposed in a first wall of the fluid guiding unit and configured to provide a first fluid flow in a first direction substantially parallel to the first portion of the curved optical surface, wherein the first fluid flow provides a shielding flow at the first optical element; and
a second nozzle disposed in a second wall of the fluid guiding unit facing the curved optical surface and adjacent to the first nozzle and configured to provide a second fluid flow adjacent to the second portion of the curved optical surface in a second direction away from the first nozzle,
wherein an angle between the first direction and the second direction is between about 70 to about 120 degrees.

2. The fluid purging system of claim 1, wherein at least one of the first nozzle and the second nozzle comprises micro-sieve outlets.

3. The fluid purging system of claim 2, wherein the micro-sieve outlets at the first nozzle have various heights.

4. The fluid purging system of claim 1, wherein the first wall comprises a tilted portion configured to direct the first fluid flow towards the curved optical surface.

5. The fluid purging system of claim 1, wherein the curved optical surface of the optical element comprises at least a concave portion.

6. The fluid purging system of claim 1, wherein an edge of at least one of the first wall and the second wall is rounded.

7. The fluid purging system of claim 1, wherein the first nozzle is arranged to provide the first fluid flow at a rate of 60% to 90% of a total fluid flow.

8. The fluid purging system of claim 1, wherein at least one of the first wall and the second wall is provided with a first coating layer.

9. The fluid purging system of claim 8, wherein the first coating layer is a non-reflective layer.

10. The fluid purging system of claim 1, wherein a surface of at least one of the first nozzle and the second nozzle is provided with a second coating layer.

11. The fluid purging system of claim 10, wherein the second coating layer is a fluid-phobic layer.

12. The fluid purging system of claim 10, wherein the second coating layer is a wear preventive layer.

13. A projection system comprising:
a fluid purging system comprising:
a fluid guiding unit arranged to guide a fluid, provided by a fluid supply system, over first and second portions of a curved optical surface of an optical element, the fluid guiding unit comprising:

a fluid inlet;

a first nozzle disposed in a first wall of the fluid guiding unit and configured to provide a first fluid flow in a first direction substantially parallel to the first portion of the curved optical surface, wherein the first fluid flow provides a shielding flow at the first curved optical element; and a second nozzle disposed in a second wall of the fluid guiding unit facing the curved optical surface and adjacent to the first nozzle and configured to provide a second fluid flow adjacent to the second portion of the curved optical surface in a second direction away from the first nozzle, wherein an angle between the first direction and the second direction is between about 70 to about 120 degrees.

14. A method comprising:

providing a first purging fluid flow at a first surface portion of a curved optical element via a first nozzle, disposed in a first wall of a fluid guiding unit, in a first direction, wherein the first purging fluid flow provides a shielding flow at the first surface portion of the curved optical element; and providing a second purging fluid flow at a second surface portion of the curved optical element via a second nozzle, disposed in a second wall of the fluid guiding unit adjacent to the first nozzle and to face the second surface portion, in a second direction away from the first nozzle at an angle between the first direction and the second direction in the range of 70 to 120 degrees.

15. The method of claim 14, wherein the first direction is essentially perpendicular to the second direction.

\* \* \* \* \*

UNITED STATES PATENT AND TRADEMARK OFFICE
CERTIFICATE OF CORRECTION

| | |
|---|---|
| PATENT NO. | : 12,411,425 B2 |
| APPLICATION NO. | : 18/001256 |
| DATED | : September 9, 2025 |
| INVENTOR(S) | : Fonseca Junior et al. |

Page 1 of 1

It is certified that error appears in the above-identified patent and that said Letters Patent is hereby corrected as shown below:

In the Claims

In Column 12, Claim 1, Line 22, delete "first" and replace with --first portion of the curved optical surface of the--.

In Column 13, Claim 13, Line 6, delete "first curved" and replace with --first portion of the curved optical surface of the--.

Signed and Sealed this
Fourteenth Day of October, 2025

John A. Squires
*Director of the United States Patent and Trademark Office*